United States Patent
Lin et al.

(10) Patent No.: US 7,961,024 B1
(45) Date of Patent: Jun. 14, 2011

(54) LOW POWER PULSE-TRIGGERED FLIP-FLOP

(75) Inventors: Jin-Fa Lin, Chiayi County (TW); Yu-Ru Cho, Yunlin County (TW); Ming-Hwa Sheu, Yunlin County (TW)

(73) Assignee: National Yunlin University of Science and Technology, Doulin, Yunlin County (TW)

( * ) Notice: Subject to any disclaimer, the term of this patent is extended or adjusted under 35 U.S.C. 154(b) by 0 days.

(21) Appl. No.: 12/692,976

(22) Filed: Jan. 25, 2010

(51) Int. Cl.
*H03K 3/356* (2006.01)
(52) U.S. Cl. .......................... 327/208; 327/212
(58) Field of Classification Search .................. 327/208, 327/210, 211, 212
See application file for complete search history.

(56) References Cited

U.S. PATENT DOCUMENTS

| | | | |
|---|---|---|---|
| 6,278,308 B1 * | 8/2001 | Partovi et al. | 327/218 |
| 7,345,519 B2 * | 3/2008 | Hirata | 327/208 |

* cited by examiner

*Primary Examiner* — Hai L Nguyen
(74) *Attorney, Agent, or Firm* — Muncy, Geissler, Olds & Lowe, PLLC

(57) ABSTRACT

A low power pulse-triggered flip-flop comprises a latch containing a first conductive line and a first connection point and a pulse generator linking to the latch. The pulse generator includes a first N-transistor, a second N-transistor, a third N-transistor, a first inverter and a first P-transistor located on the first conductive line. The first N-transistor is connected to the first connection point and first conductive line. The second N-transistor and the third N-transistor are connected to the first conductive line, a second conductive line and a third conductive line. The first inverter is connected to the second conductive line. The present invention aims to reduce leakage power in a high level fabrication process, and can save power consumption and power-delay-product more than 17% over the conventional pulse triggered flip-flop, and also provides a smaller size of total transistors to lower average leakage current power consumption by 2.4 times.

9 Claims, 7 Drawing Sheets

| Performances of P-FF | ip-DCO | MHLFF | SCCER | CPFF |
|---|---|---|---|---|
| Triggered Mode | Single | Single | Single | Single |
| #of Transistors | 23 | 19 | 17 | 19 |
| Layout Area($\mu m^2$) | 91.88 | 93.02 | 80.07 | 79.17 |
| Pulse Enhancement(pS) | No | No | No | Yes(152/93) |
| Setup Time (pS) | -37 | 4.0 | -64 | -53.9 |
| Hold Time (pS) | 64.45 | 75.33 | 73.00 | 97.8 |
| Data to Q(pS) $T_{DQ}$ | 118.75 | 177.20 | 112.20 | 116.9 |
| Average Power($\mu W$) | 35.54 | 27.61 | 28.46 | 22.65 |
| $PDP_{DQ}$ (fJ) | 4.220 | 4.892 | 3.193 | 2.648 |
| Avg. Power Reduction | 36.3% | 18.0% | 20.4% | — |
| $PDP_{DQ}$ Reduction | 37.3% | 45.9% | 17.1% | — |

Fig. 3

| Leakage Power($\mu m$) | ip-DCO | MHLFF | SCCER | CPFF |
|---|---|---|---|---|
| CLK=0 Data=0 | 3.737 | 3.656 | 0.639 | 0.444 |
| CLK=0 Data=1 | 1.317 | 0.666 | 1.208 | 0.481 |
| CLK=1 Data=0 | 0.834 | 2.161 | 0.779 | 0.582 |
| CLK=1 Data=1 | 1.364 | 0.763 | 0.823 | 0.624 |
| Minimum Leakage Power | 0.834 | 0.666 | 0.639 | 0.444 |
| Average Leakage Power | 1.813 | 1.812 | 0.862 | 0.533 |

Fig. 4

LOW POWER PULSE-TRIGGERED FLIP-FLOP

FIELD OF THE INVENTION

The present invention relates to a circuit design of flip-flop and particularly to a low power pulse-triggered flip-flop.

BACKGROUND OF THE INVENTION

Conventional very large scale integrated circuit (VLSI) systems rely on System on a Chip (SoC) to achieve higher performance and receive more diversified architectures. As the chip function becomes more diversified and complex, and clock frequency and total number of transistors decrease gradually, total leakage power becomes more severe. Design of low power circuits, therefore, becomes very important to reduce power consumption of the chip becomes a big issue and research focus at present.

Because the SoC clock circuit and storage circuit are the main cause of power loss, design of a lower power storage element becomes a critical factor to reduce total power consumption of SoC.

Flip-Flop (FF) is an important and widely used storage element, especially on mobile devises such as notebook computers, personal digital assistants (PDAs) and cell phones. Hence, design of flip-flop plays a big role to meet such a requirement for providing a higher performance at a lower power. In SoC applications clock system (including clock distribution networks and storage elements) consumes power about 20% to 45% of total system. In the clock system the number of transistors and power consumption mostly are taken by the flip-flops. Thus reducing the power consumption of the flip-flop can greatly improve total power performance.

At present on research of the flip-flop, pulse-triggered flip-flop (PTFF) has been successfully used on many high performance and/or low power processors. For instance, on Intel's Pentium processor chips more than 90% of the flip-flop adopts PTFF architecture. Besides improving system performance, it also reduces power consumption and can resolve incurred cooling and chip packaging issues.

In the conventional design of PTFF the generated pulse is maintained at the same width and intensity. However, the flip-flop used on high order system circuits do not maintain a constant triggered operation, but always in a standby state. Since the pulse clock of PTFF is maintained at the same width and intensity, extra power loss incurs. While PTFF can improve some drawbacks of the conventional flip-flop as previously discussed, at present there are no design and research reports that have announced regard changing circuit pulse width and intensity according to input data of flip-flop.

SUMMARY OF THE INVENTION

Therefore the primary object of the present invention is to provide a low power pulse-triggered flip-flop.

The low power pulse-triggered flip-flop according to the present invention comprises a latch which includes a first conductive line and a first connection point, and a pulse generator linking to the latch. The pulse generator includes a first N-transistor, a second N-transistor, a third N-transistor, a first P-transistor and a first inverter. The first N-transistor has a gate, a first end and a second end. The first end of the first N-transistor is connected to the first connection point. The gate of the first N-transistor is connected to the first conductive line. The second N-transistor has a gate, a first end and a second end. The second end of the second N-transistor is connected to the first conductive line. The third N-transistor has a gate, a first end and a second end. The second end of the third N-transistor is connected to the first conductive line, and the first end of the third N-transistor is connected to a second conductive line. The second conductive line transmits a clock signal. The second conductive line has a second connection point and a third connection point. The second connection point is linked to the gate of the second N-transistor. The gate of the third N-transistor and the first end of the second N-transistor are linked by a third conductive line on the third connection point. The first P-transistor has a gate, a first end and a second end. The second end of the first P-transistor is connected to the first conductive line. The first inverter is connected to the second conductive line and located between the second connection point and the third connection point.

By means of the structure set forth above, the low power pulse-triggered flip-flop of the present invention is formed. It provides many benefits, notably:

1. The present invention is a logic gate circuit adopted a Pass Transistor Logic (PTL) architecture to shorten discharge route. It is incorporated with a Conditional Pulse Enhancement Technique to further reduce circuit power consumption. Through these two novel circuits the transistor dimension (and capacitor load) of the Delay Inverter and pulse generation circuit on the clock system can be shrunk. Compared with the conventional design increasing processing speed constantly, the present invention provides a circuit of lower power consumption to extend product working time and prevent elements from heat loss. The lower power circuit design can meet specification requirements and reduce power waste, and further lower power consumption when in use.

2. The present invention employs Post-Layout Simulation of UMC CMOS 90 nm fabrication process technique. The results show that power consumption and Power-Delay-Product save more than 17%. Coupled with the shrunk total transistor size, the design provided by the present invention reduces 2.4 times of average leakage current power loss.

The foregoing, as well as additional objects, features and advantages of the present invention will be more readily apparent from the following detailed description, which proceeds with reference to the embodiments and accompanying drawings. The embodiments serve merely for illustrative purpose and are not the limitation of the present invention.

BRIEF DESCRIPTION OF THE DRAWINGS

FIG. 3 is a characteristics comparison table of the present invention and conventional techniques.

FIG. 4 is a leakage current power loss comparison table of the present invention and conventional techniques.

DETAILED DESCRIPTION OF THE PREFERRED EMBODIMENTS

Figure 1:
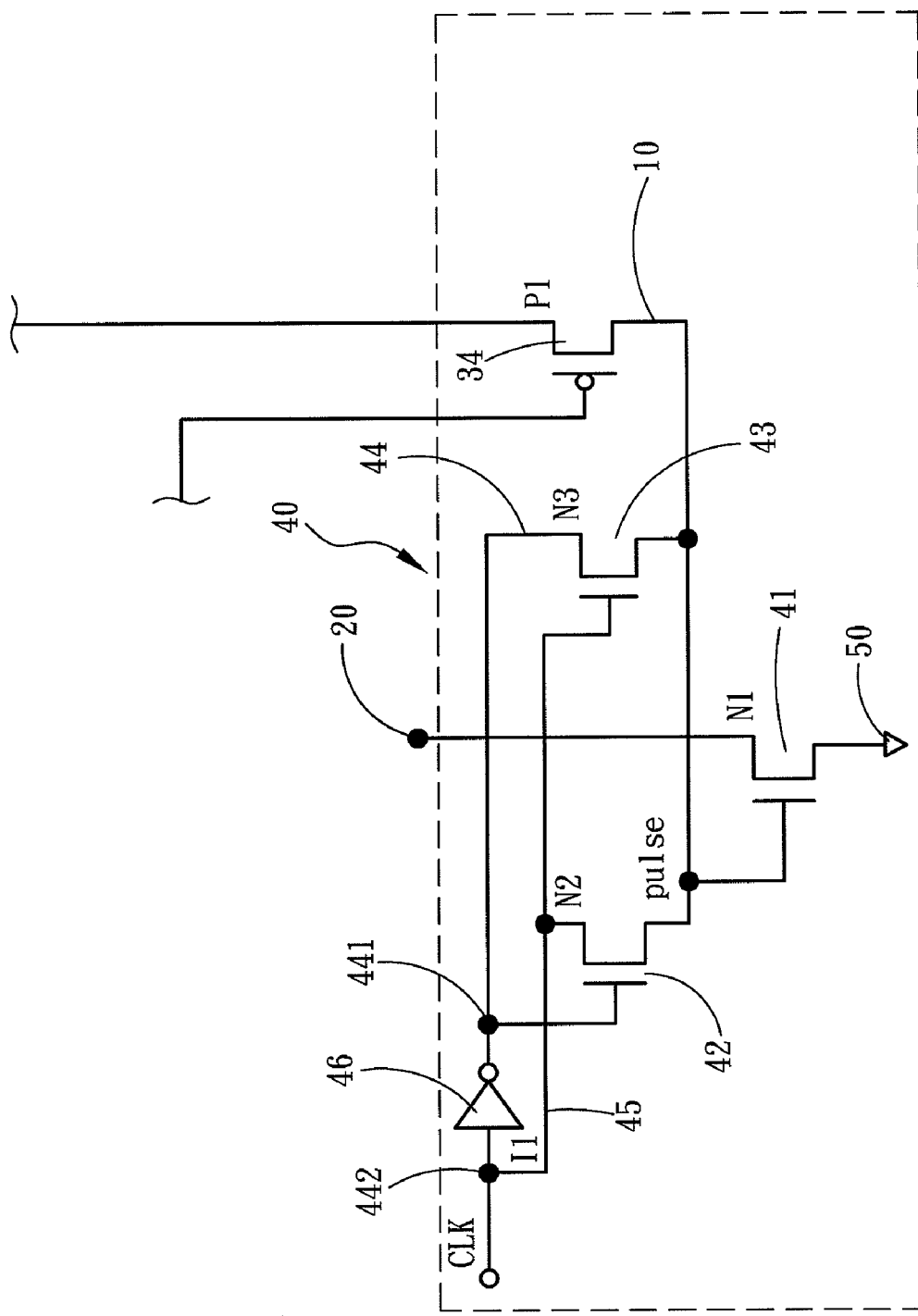
FIG. 1 is a schematic circuit diagram of the present invention.
Figure 2:
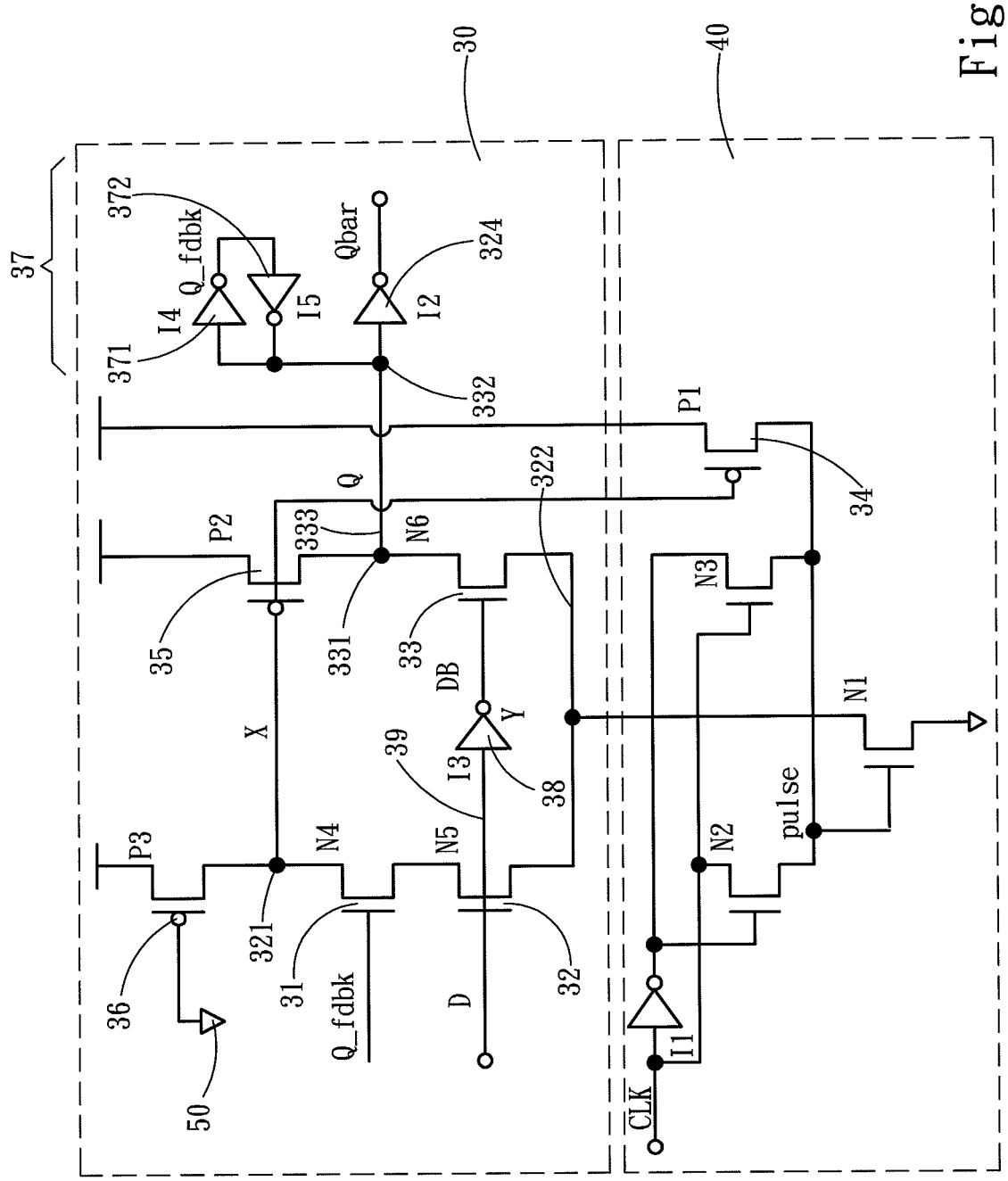
FIG. 2 is a schematic circuit diagram of the present invention coupled with a latch.

Refer to FIG. 1 and FIG. 2. The low power pulse-triggered flip-flop according to the present invention comprises a latch 30 containing a first conductive line 10 and a first connection point 20 and a pulse generator 40 linking to the latch 30. The pulse generator 40 includes a first N-transistor 41, a second N-transistor 42, a third N-transistor 43, a first P-transistor 34 and a first inverter 46. The first N-transistor 41 has a gate, a first end and a second end. The first end of the first N-transistor 41 is connected to the first connection point 20. The gate of the first N-transistor 41 is connected to the first conductive line 10. The second end of the first N-transistor 41 is connected to a ground 50.

The second N-transistor 42 has a gate, a first end and a second end. The second end of the second N-transistor 42 is connected to the first conductive line 10.

The third N-transistor 43 has a gate, a first end and a second end. The second end of the third N-transistor 43 is connected to the first conductive line 10, and the first end of the third N-transistor 43 is connected to a second conductive line 44. The second conductive line 44 transmits a clock signal. The second conductive line 44 has a second connection point 441 and a third connection point 442. The second connection point 441 is linked to the gate of the second N-transistor 42. The gate of the third N-transistor 43 and the first end of the second N-transistor 42 are linked by a third conductive line 45 on the third connection point 442. The first P-transistor 34 has a gate, a first end and a second end. The second end of the first P-transistor 34 is connected to the first conductive line 10. The first inverter 46 is connected to the second conductive line 44 and located between the second connection point 441 and the third connection point 442.

The latch 30 includes a fourth N-transistor 31, a fifth N-transistor 32, a sixth N-transistor 33, a second P-transistor 35 and a third P-transistor 36.

The fourth N-transistor 31, fifth N-transistor 32 and third P-transistor 36 are coupled in series. The fourth N-transistor 31 has a gate to perform conditional discharged. The fourth N-transistor 31 and the third P-transistor 36 are bridged by a fourth connection point 321. The third P-transistor 36 has a gate linked to the ground 50.

The sixth N-transistor 33 is coupled with the second P-transistor 35 in series. The sixth N-transistor 33 and the second P-transistor 35 are bridged by a fifth connection point 331. The sixth N-transistor 33 and fifth N-transistor 32 have respectively a second end connected through a fourth conductive line 322. The first connection point 20 is located on the fourth conductive line 322. The fifth N-transistor 32 and the sixth N-transistor 33 have respectively a gate linked by a fifth conductive line 39. The fifth N-transistor 32 and the sixth N-transistor 33 are bridged by a third inverter 38 which is located on the fifth conductive line 39. The gate of the fifth N-transistor 32 receives an input signal.

The gates of the first P-transistor 34 and the gate of the second P-transistor 35 are connected on the fourth connection point 321.

The fifth connection point 331 and sixth connection point 332 are linked through a sixth conductive line 333. The sixth connection point 332 is linked to a second inverter 324 and a feedback circuit 37. The feedback circuit 37 includes a fourth inverter 371 and a fifth inverter 372 to perform conditional discharged. An output signal is generated between the fifth connection point 331 and sixth connection point 332.

Refer to FIGS. 1 and 2 for the circuit of the present invention coupled with the latch 30. When the circuit of the present invention is in use, (1) when clock signal CLK is "Low", input signal D is "0", output signal Q is "0", and control signal Q fdbk is "1";

(2) when the clock signal CLK is "Low", input signal D is "0→1", as the control signal Q fdbk is "1" at the previous state, hence a first node X between the fourth connection point 321 and the second P-transistor 35 discharges to a second node Y formed on the first connection point 20; when the second node Y is charged to "1" the latch 30 is ready to receive a signal generated by the pulse generator 40;

(3) when the clock signal CLK is "Low→High", input signal D is "0→1", as a normal state transformation occurs, the second N-transistor 42 and the third N-transistor 43 are set ON for an inverter delay period, and each sends a VDD-VTn signal to a third node pulse linked to the gate of the first N-transistor 41 and the first conductive line 10; when the second node Y is charged to "1" at the previous state, the first N-transistor 41 is set ON quickly;

When the fifth N-transistor 32 and the first N-transistor 41 are ON, the signal at the first node X is discharged to "0" to set On for the second P-transistor 35 and the first P-transistor 34.

When the first P-transistor 34 is ON, a threshold voltage loss problem of the third node (pulse clock) would be enhanced to give the third node (pulse clock) characteristics of conditional pulse enhancement and potential.

When the second P-transistor 35 is set ON, output signal Q is charged to "1" to receive input signal D value; as a fourth node DB on the fifth conductive line 39 is "0", the sixth N-transistor 33 is OFF, hence no discharge takes place, and the output signal Q can maintain the captured data value.

(4) when the clock signal CLK is "High →Low", input signal D is "1→0", the pulse generator 40 is OFF, output signal Q maintains the captured value of the previous state;

(5) when the clock signal CLK is "Low →High", input signal D is "1→0", the second N-transistor 42 and third N-transistor 43 are set ON for an inverter delay duration, and each sends a VDD-VTn signal to the third node pulse; the fifth N-transistor 32 is OFF, and the fourth node DB is "0", the sixth N-transistor 33 and first N-transistor 41 are ON, output signal Q discharges to "0"; as the first node X does not discharge to "0", the first P-transistor 34 is not set ON, hence the third node pulse maintains a smaller pulse signal without triggering pulse enhancement action;

(6) when the clock signal CLK is "High→Low", data is "1-0", the pulse generator 40 is OFF, output signal Q maintains the captured value of the previous state.

(7) when the clock signal CLK is "Low", Data is "0", return to step (1).

Refer to FIG. 3 for characteristics comparison of the present invention and conventional techniques that shows the simulation results of a number of flip-flop, including CPFF of the present invention, SCCER published in 2009, MHLFF published in 2005 and ip-DCO provided by Intel in 2001. The simulated duty frequency is 500 MHz, average power consumption of the present invention at data switch probability of 50% is superior respectively to ip-DCO, MHLFF and SCCER by 36.3%, 28% and 20.4%. Power delay product (PDP$_{DQ}$) lowers by 37.3%, 45.9% and 17.1%.

In terms of transistor number, the present invention has two more sets than SCCER, but the layout area of the present invention still is slightly smaller than SCCER. This is because the present invention provides a short critical path approach and conditional pulse enhancement control that can shrink the size of the transistors as well as loading capacitance on clock tree.

Refer to FIG. 4 for leakage current power loss comparison of the present invention and conventional techniques that show power consumption of the flip-flop at a leakage current, wherein ip-DOC and MHLFF have the most significant leakage current power consumption. MHLFF circuit does not have a full voltage swing signals, hence its same transistors cannot be fully turn OFF that results in higher DC power consumption. Ip-DCO contains transistors of a greater size and extra charge and discharge operation. In term of total average leakage current power consumption, because of the shrinking size of transistors, the CPFF provided by the present invention can greatly reduce leakage current power than the circuits of ip-DCO and MHLFF by 2.4 times.

Figure 5:
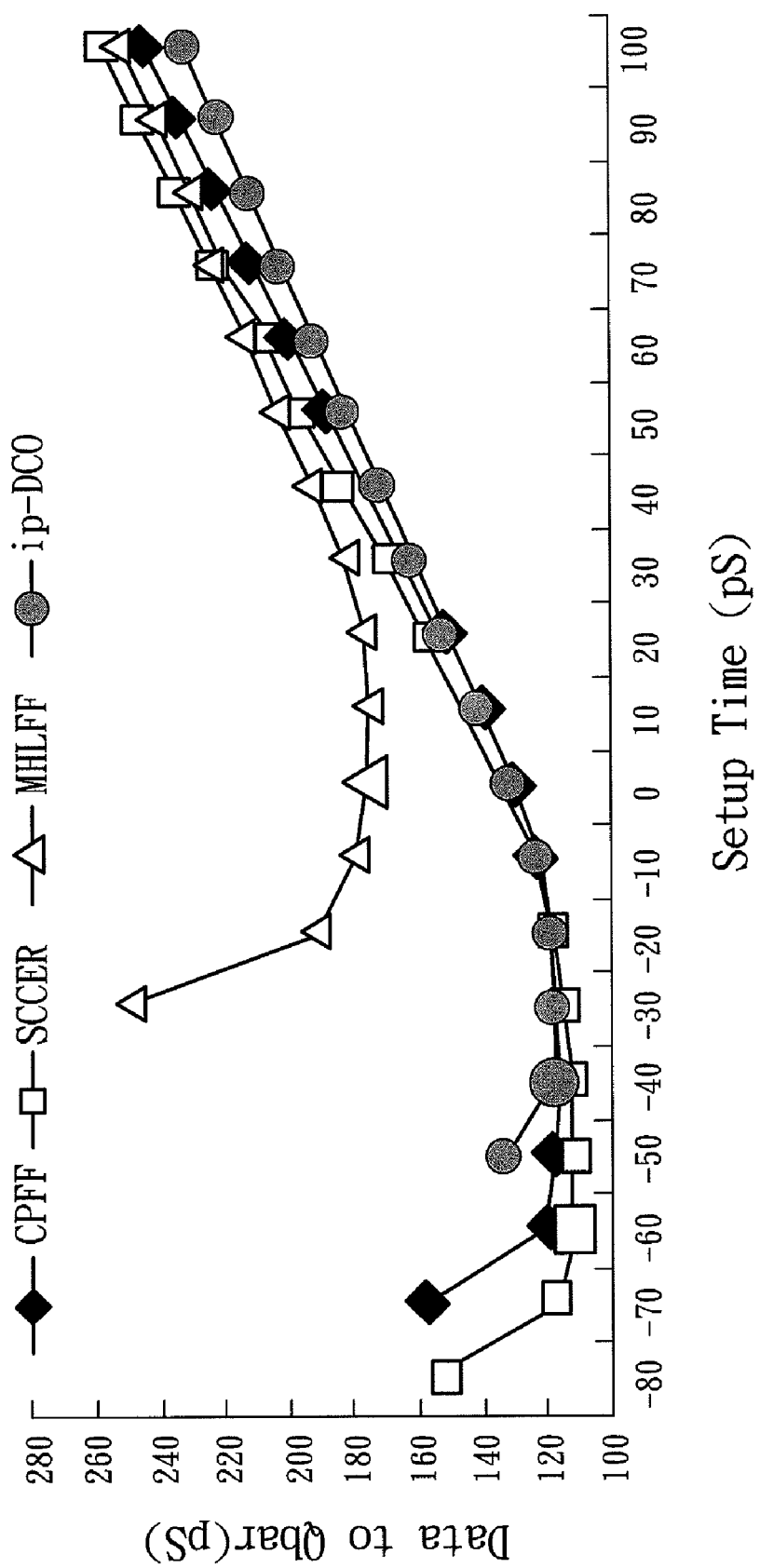
FIG. 5 is a setup time and delay time comparison table of the present invention and conventional techniques.
Figure 6:
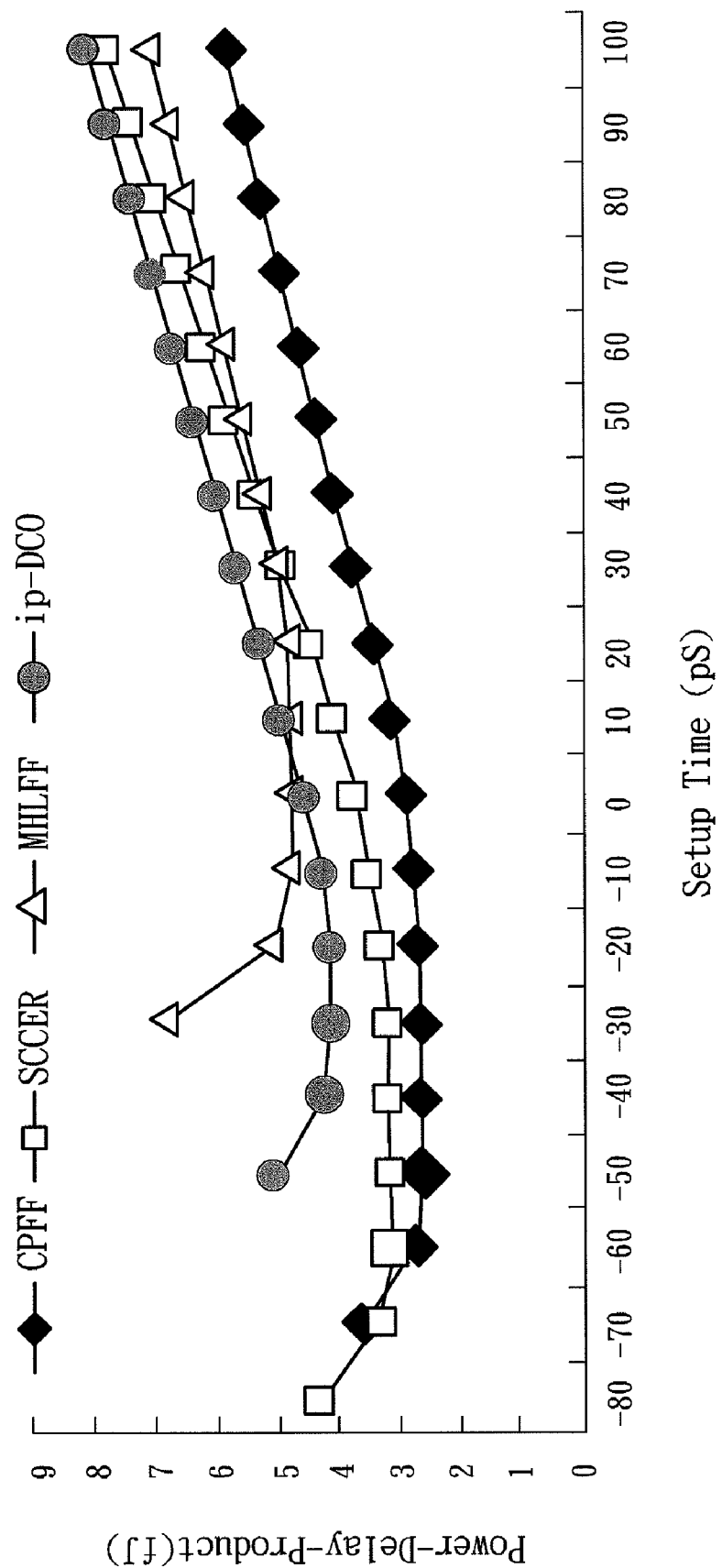
FIG. 6 is a setup time and power delay product comparison table of the present invention and conventional techniques.
Figure 7:
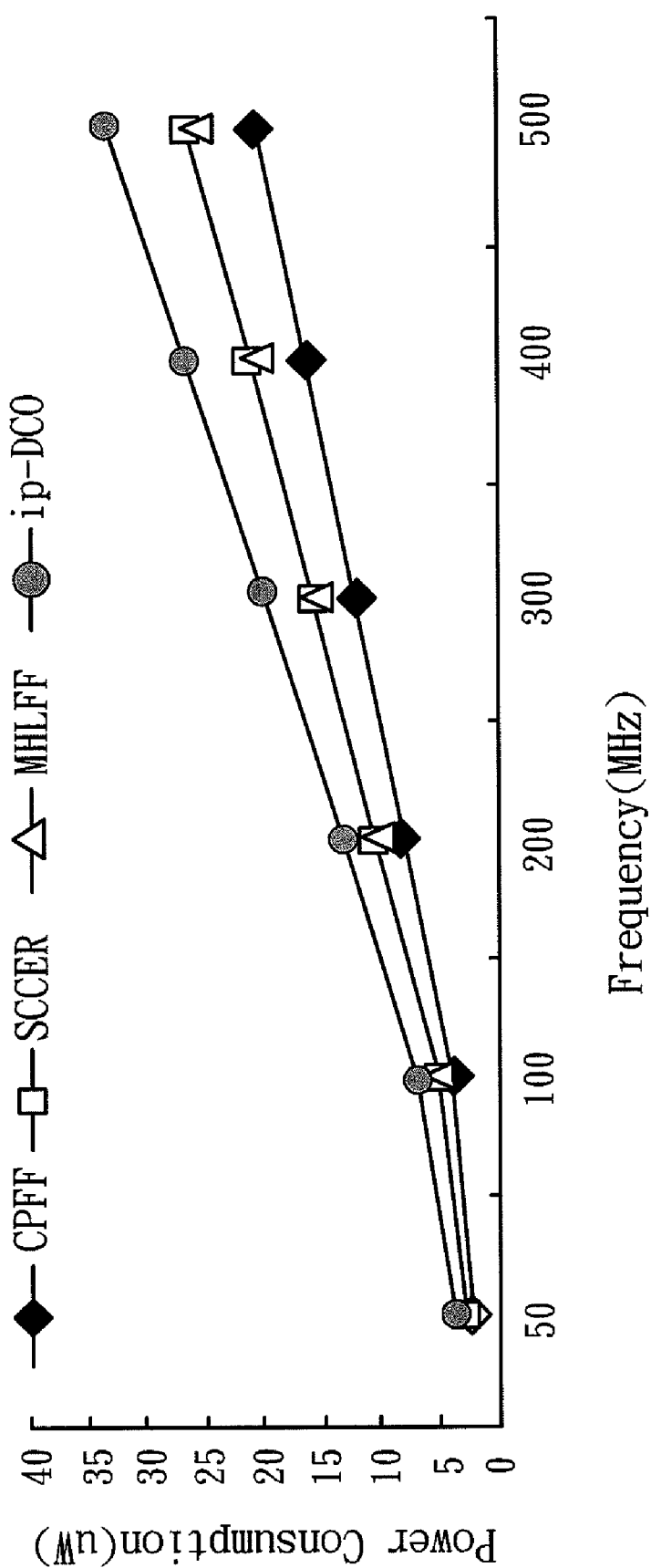
FIG. 7 is a duty frequency and average power consumption comparison table of the present invention and conventional techniques.

Refer to FIGS. 5, 6 and 7 for setup time and delay time comparison, setup time and power delay product comparison, and duty frequency and average power consumption comparison of the present invention and conventional techniques. FIGS. 5 and 6 show the relationships of setup time, delay time (TDQ) and power delay product (DOPDQ) under the conditions of: the data switch probability is 50%; the supply voltage is 1V; and the duty frequency and temperature are respectively 500 MHZ and 25° C.

FIG. 7 shows power consumption relationship at different duty frequencies. The CPFF circuit provided by the present invention is superior to SCCER circuit by 25.1% at duty frequency 50 MHz, by 24.9% at 500 MHz. Hence, it is at a stable state in terms of impact of the duty frequency to the power consumption on the circuit.

As a conclusion, the present invention provides control without extra circuits, thus does not consume extra power by the circuit or increase the load of the clock system. Compared with other conventional circuits the present invention can save power consumption in the range between 18% and 36%, and power delay product (PDP$_{DQ}$) decreases in the range between 17% and 50%. Most significantly, the present invention can reduce the average leakage current power by 2.4 times. All the test data indicate that the circuit of the present invention provides a lower power and a novel conditional pulse enhancement function.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A low power pulse-triggered flip-flop comprising a latch which contains a first conductive line and a first connection point, and a pulse generator linking to the latch, the pulse generator including:
a first N-transistor which contains a gate, a first end and a second end, the first end being connected to the first connection point and the gate being connected to the first conductive line;
a second N-transistor which contains a gate, a first end and a second end, the second end thereof being connected to the first conductive line;
a third N-transistor which contains a gate, a first end and a second end, the second end thereof being connected to the first conductive line, the first end thereof being connected to a second conductive line, the second conductive line transmitting a clock signal and containing a second connection point and a third connection point, the second connection point being connected to the gate of the second N-transistor, the gate of the third N-transistor being connected to the first end of the second N-transistor through a third conductive line on the third connection point;
a first P-transistor which contains a gate, a first end and a second end, the second end thereof being connected to the first conductive line; and
a first inverter which is connected to the second conductive line and located between the second connection point and the third connection point.

2. The low power pulse-triggered flip-flop of claim 1, wherein the second end of the first N-transistor is connected to a ground.

3. The low power pulse-triggered flip-flop of claim 1, wherein the latch comprises a fourth N-transistor, a fifth N-transistor, a sixth N-transistor, a second P-transistor and a third P-transistor;
wherein the fourth N-transistor, the fifth N-transistor and the third P-transistor are coupled in series, the fourth N-transistor and the third P-transistor being bridged by a fourth connection point;
wherein the sixth N-transistor and the second P-transistor are coupled in series and bridged by a fifth connection point, the sixth N-transistor containing a second end connecting to a second end of the fifth N-transistor through a fourth conductive line, the first connection point being located on the fourth conductive line, the fifth N-transistor containing a gate connecting to a gate of the sixth N-transistor through a fifth conductive line, the gate of the fifth N-transistor receiving an input signal;
wherein the gate of the first P-transistor and the gate of the second P-transistor are connected on the fourth connection point;
wherein the fifth connection point is connected to the sixth connection point through a sixth conductive line, the sixth connection point being connected to a second inverter and a feedback circuit.

4. The low power pulse-triggered flip-flop of claim 3, wherein the third P-transistor contains a gate connecting to the ground.

5. The low power pulse-triggered flip-flop of claim 3 further including a third inverter on the fifth conductive line between the fifth N-transistor and the sixth N-transistor.

6. The low power pulse-triggered flip-flop of claim 3, wherein the feedback circuit includes a fourth inverter and a fifth inverter.

7. The low power pulse-triggered flip-flop of claim 3, wherein the fourth N-transistor contains a gate to control signal linkage.

8. The low power pulse-triggered flip-flop of claim 3, wherein the feedback circuit controls signal linkage.

9. The low power pulse-triggered flip-flop of claim 3, wherein between the fifth connection point and the sixth connection point an output signal is generated.

* * * * *